United States Patent [19]

Chiba et al.

[11] Patent Number: 4,909,914

[45] Date of Patent: Mar. 20, 1990

[54] REACTION APPARATUS WHICH INTRODUCES ONE REACTING SUBSTANCE WITHIN A CONVERGENT-DIVERGENT NOZZLE

[75] Inventors: Yuji Chiba, Atsugi; Kenji Ando, Kawasaki; Tatsuo Masaki, late of Yokohama, by Yoshiko Masaki, legal successor; Masao Sugata, Yokohama; Kuniji Osabe, Tama; Osamu Kamiya, Machida; Hiroyuki Sugata, Atsugi; Toshiaki Kimura, Kawasaki; Masahiro Haruta, Tokyo, all of Japan

[73] Assignee: Canon Kabushiki Kaisha, Tokyo, Japan

[21] Appl. No.: 53,555

[22] Filed: May 21, 1987

Related U.S. Application Data

[63] Continuation-in-part of Ser. No. 843,570, Mar. 25, 1986, abandoned.

[30] Foreign Application Priority Data

| May 11, 1985 | [JP] | Japan | 60-098897 |
| Jul. 4, 1985 | [JP] | Japan | 60-145823 |
| Jul. 4, 1985 | [JP] | Japan | 60-145824 |

[51] Int. Cl.⁴ .................................. C25B 11/02
[52] U.S. Cl. .................... 204/164; 239/81; 219/121.47; 219/121.5; 219/121.52; 219/76.16; 204/157.41; 204/157.43; 204/157.61; 204/157.44; 204/157.63; 422/186.04; 422/186.21; 427/34; 118/715; 118/719
[58] Field of Search ............... 118/301, 308, 310, 315, 118/620, 621, 715, 719, 722, 723; 427/34, 38, 180, 195, 201, 252, 426; 239/80, 81, 85, 288, 499, 540, 589, 590.5, 597, 566; 219/121 PL, 121 PP, 121 PR, 121 PQ, 121 PG, 76.16; 406/123, 170, 194; 204/164

[56] References Cited

U.S. PATENT DOCUMENTS

| 2,175,160 | 10/1939 | Zobel et al. | 239/589 |
| 2,919,370 | 12/1959 | Giannini et al. | 219/121 PP |
| 3,003,939 | 10/1961 | Rouy et al. | 204/164 |
| 3,005,762 | 10/1961 | Fenn | 204/164 |

(List continued on next page.)

FOREIGN PATENT DOCUMENTS

| 0064288 | 11/1982 | European Pat. Off. |
| 2443137 | 6/1980 | France |
| 58-58276 | 4/1983 | Japan |
| 222209 | 9/1924 | United Kingdom |
| 415446 | 8/1934 | United Kingdom |
| 721364 | 1/1955 | United Kingdom |
| 1057120 | 2/1967 | United Kingdom |
| 1092534 | 11/1967 | United Kingdom |
| 1155495 | 10/1969 | United Kingdom |
| 1336253 | 11/1973 | United Kingdom |

OTHER PUBLICATIONS

Spurk, J. H.; Vorlesung Strömungslehre II, Darmstadt, Technical University Darmstadt, 1974, pp. 0-6 to 0-9 and 2-154 to 2-175.

Landau, L. D., Litschutz, E. M., Lehrbuch der Theoretischen Physik, Hydrodynamik, vol. VI, Berlin, Akademie-Verlag, 1981, pp. 403-408.

English equivalent abstract with drawing figure for Japanese application (KOKAI) 58-58276 published 4-6-83.

English equivalent abstract with drawing figure for Japanese application (KOKAI) 59-56504 published 4-2-84.

Primary Examiner—Shrive Beck
Assistant Examiner—Alain Bashore
Attorney, Agent, or Firm—Fitzpatrick Cella Harper & Scinto

[57] ABSTRACT

A reaction apparatus is provided which comprises a flow control system provided with a convergent-divergent nozzle. This nozzle is operated under the optimum expansion condition, and the differential coefficient of the streamline of the channel inside the nozzle varies continuously and reaches zero at a throat of the nozzle.

4 Claims, 5 Drawing Sheets

U.S. PATENT DOCUMENTS

| | | | |
|---|---|---|---|
| 3,010,009 | 11/1961 | Ducati | 219/121 PL |
| 3,075,065 | 1/1963 | Ducati et al. | 219/121 PP |
| 3,280,018 | 10/1966 | Denis | 204/164 |
| 3,309,873 | 3/1967 | Cann | 219/121 PP |
| 3,507,294 | 4/1970 | Fix et al. | 137/81.5 |
| 3,556,409 | 1/1971 | Johannisson | 239/433 |
| 3,670,400 | 6/1972 | Singer | 29/527.5 |
| 3,839,618 | 10/1974 | Muehlberger | 219/121 PL |
| 3,904,505 | 9/1975 | Aisenberg | 204/298 |
| 3,914,573 | 10/1975 | Muehlberger | 219/121 PP |
| 4,006,340 | 2/1977 | Gorinas | 219/121 PL |
| 4,199,104 | 4/1980 | Houben | 239/85 X |
| 4,200,264 | 4/1980 | Hori | 266/149 |
| 4,231,518 | 11/1980 | Zverev et al. | 239/85 X |
| 4,275,287 | 6/1981 | Hiratake | 219/121.52 |
| 4,297,971 | 11/1981 | Henery | 118/719 |
| 4,389,973 | 6/1983 | Suntola et al. | 118/725 |
| 4,540,121 | 9/1985 | Browning | 219/121 PL |
| 4,603,810 | 8/1986 | Schleimer et al. | 239/589 X |

REACTION APPARATUS WHICH INTRODUCES ONE REACTING SUBSTANCE WITHIN A CONVERGENT-DIVERGENT NOZZLE

This application is a continuation-in-part of application Ser. No. 843,570 filed Mar. 25, 1986, now abandoned.

BACKGROUND OF THE INVENTION

The present invention relates to a reaction apparatus for raw materials which are in gaseous state or can be formed as a substantially gaseous flow such as fine liquid or solid particles suspended in gas, and in particular to a reaction apparatus equipped with a convergent-divergent nozzle.

In the present specification, the convergent-divergent nozzle means a nozzle in which the aperture is gradually constricted from the inlet to an intermediate part to form a throat, and is then gradually spread from said throat to the outlet. The reaction means not only chemical reactions but also physical changes not involving chemical reaction, such as phase changes of the raw materials among gaseous, liquid and solid phases, formation of a cluster, or activation of raw materials.

DESCRIPTION OF THE RELATED ART

The U.S. Pat. No. 4,200,264 discloses an apparatus for producing metallic Mg or Ca by a carbon reduction method.

Said apparatus produces finely powdered Mg or Ca by heating an oxide of Mg or Ca and carbon to induce a reduction reaction therebetween, and introducing the obtained product into a divergent nozzle for instantaneous cooling by adiabatic expansion.

The divergent nozzle in said apparatus achieves instantaneous cooling of the mixture of Mg (or Ca) and CO to prevent the reverse reaction therebetween, utilizing a fact that said nozzle rapidly cools the passing gas by adiabatic expansion. Said divergent nozzle functions under a condition of underexpansion, and is utilized for separating Mg (or Ca) and CO.

Stated differently, the divergent nozzle in the aforementioned apparatus is utilized as means for preventing reverse reaction of the products, Mg (or Ca) and CO, and separating said products before they are introduced into condensers, but is not utilized as reaction control means for maintaining the products as an easily processable beam flow.

However, the use of a divergent nozzle for rapid cooling to a temperature suitable for preventing a reaction, or for accelerating the products to a desired velocity is irrelevant to the state of flow of the gas that has passed the nozzle.

In case the pressure in the throat of the divergent nozzle is below the critical pressure, the gas flow from the divergent nozzle is decelerated, diffused after ejection and does not reach the acoustic velocity. On the other hand, if the pressure in said throat is equal to or higher than the critical pressure, the ejecting velocity from the nozzle can be supersonic but the state of flow after ejection is determined by whether the pressure $P_j$ of the gas flow at the ejection approximately coincides with the pressure P in the downstream side of the divergent nozzle. A state of $P_j = P$ is called an optimum expansion, while a state of $P_j > P$ is called underexpansion, and a state of $P_j < P$ is called overexpansion. In case of the optimum expansion, the gas passing through the divergent nozzle flows along the internal wall at the outlet of said nozzle and is ejected as a flow having a uniform distribution of speed in the cross-sectional direction. On the other hand, in case of underexpansion or overexpansion, the flow is decelerated and is diffused.

However, the divergent nozzle in the aforementioned apparatus is employed, as explained above, in a mode irrelevant to the formation of a flow under optimum expansion, so that the flow ejected from the divergent nozzle is inevitably diffused. Once such diffused flow is generated, the products in finely powdered state are diffused in the entire capturing chamber, and a part of such products contacts the walls thereof, thus causing deposition thereon or losing activity. These phenomena lead to various drawbacks such as a loss in production yield and contamination of the reaction products with unreacted substances. Further, the reaction products transported in a diffused flow are difficult to capture and results also in a lowered yield. Besides, certain raw materials or reaction products require activation by plasma or laser beam irradiation after passing the nozzle, but such activation is difficult to achieve in a diffused flow, so that a general-purpose reaction apparatus is difficult to obtain.

SUMMARY OF THE INVENTION

An object of the present invention is to provide a novel reaction apparatus not associated with the above-mentioned drawbacks of the conventional technology.

Another object of the present invention is to provide a reaction apparatus capable of transporting material to be reacted or reaction products in a form of a beam.

Still another object of the present invention is to provide a reaction apparatus and an energy supplying process allowing effective energy supply to the materials to be reacted.

More specifically the present invention provides a reaction apparatus provided with a flow control system composed of a convergent-divergent nozzle.

Also, the present invention provides a reaction apparatus provided with a convergent-divergent nozzle in which a field of reaction is formed.

Furthermore the present invention provides a process for supplying energy to a flow of fine particles which comprises supplying energy to the downstream side of a flow path involving the interior of the convergent-divergent nozzle.

BRIEF DESCRIPTION OF THE DRAWINGS

FIG. 2, comprising

FIG. 3, comprising

FIG. 4, comprising

FIG. 5, comprising

FIG. 7, comprising

DETAILED DESCRIPTION OF THE PREFERRED EMBODIMENTS

Figure 1:
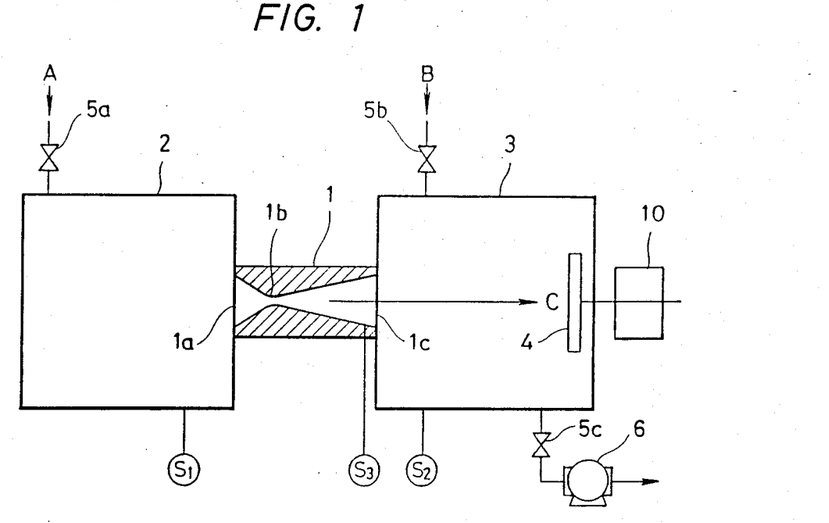
FIG. 1 is a schematic view of an embodiment of the present invention.

In the present invention, as shown in FIG. 1, raw materials or reaction products are introduced from an inlet $1a$ of a convergent-divergent nozzle 1 to a throat $1b$ thereof, and are ejected as an optimum expansion flow from an outlet $1c$. The optimum expansion flow means a flow ejected from the convergent-divergent nozzle 1 and having a pressure Pj, at the ejection, substantially equal to the pressure P of the downstream side of the nozzle 1.

In case the flow is adiabatically expanded in the convergent-divergent nozzle 1, the Mach number M reached by the flow is determined as a function of the pressure Po in an upstream chamber 2 and the pressure P of a downstream chamber 3, by the following equation:

$$M = \frac{u}{a} = \left[\left(\frac{P_o}{P}\right)^{\frac{\gamma-1}{\gamma}} - 1\right] \frac{2}{\gamma - 1} \quad (1)$$

wherein u is the velocity of the fluid, a is the acoustic velocity at the outlet, and $\gamma$ is the ratio of specific heats of the flow material.

The acoustic velocity a can be determined from the following equation:

$$a = \sqrt{\gamma R T}$$

wherein T is the local temperature and R is gas constant. Also there stands the following relation among the aperture area A at the outlet $1c$, aperture area A* at the throat $1b$ and Mach number M:

$$\frac{A}{A^*} = \frac{1}{M} \left[\frac{2}{\gamma + 1}\left(1 + \frac{\gamma - 1}{2} M^2\right)\right]^{\frac{\gamma+1}{2(\gamma-1)}} \quad (2)$$

The flow reaches a state of optimum expansion flow in case the Mach number M determined by the equation (1) as a function of the pressure ratio P/Po of the upstream chamber 2 and the downstream chamber 3 coincides with the Mach number determined by the equation (2) as a function of the aperture area A of the outlet $1c$ and the aperture area A* of the throat $1b$. In such state the ratio P/Po is below the critical ratio of pressure, and the Mach number M exceeds 1. The flow velocity u can be determined from the following equation (3):

$$u = M \sqrt{\gamma R T_o} \left(1 + \frac{\gamma - 1}{2} M^2\right)^{1/2} \quad (3)$$

wherein To represents the temperature of the upstream chamber 3.

An optimum expansion flow ejected from the outlet $1c$ of the nozzle 1 flows along the inner wall of the outlet $1c$ with a substantially uniform velocity distribution in the cross section and is formed as a beam, which means a linear flow of a substantially fixed trajectory. The beam formation minimizes the diffusion and allows to maintain the raw materials or the reaction products, ejected from the nozzle 1, in a spatially independent state from the walls of the downstream chamber 3, thus preventing undesirable effects caused by contact with the walls. The loss in yield caused by diffusion can also be prevented if the flow is captured in the beam state by a substrate 4. Furthermore the activation of the raw materials or reaction products with plasma or laser beam irradiation can be more effectively achieved by effecting such energy supply onto the flow in a beam state.

The "beam" in the present invention means a jet stream flowing with directivity in one direction and with a higher density than that of surrounding space irrespective of the shape of the section of the stream.

When the jet stream comprises molecular particles, the beam characteristics can be detected by measuring the stream intensity of flying molecules by means of an orifice connected to a differential evacuation system of a mass spectrometer and moving perpendicularly across the beam.

With a nozzle having a circular cross section, the output from the mass spectrometer reaches the maximum value at the center of the beam. The output value will decrease gradually with the distance from the center. The distance between the center of the beam and the point where the detected value has decreased to half the maximum output is measured. The beam diameter is defined as twice the distance measured above.

The divergence of the beam is evaluated by the divergence angle of the beam defined by the formula below:

$$\theta = \text{Tan}^{-1} 1/2 \{(d_2 - d_1)/(l_2 - l_1)\}$$

where $d_1$ denotes the beam diameter at a distance $l_1$ from the exit of the nozzle to downstream direction, and $d_2$ at the distance $l_2$.

The desirable $\theta$ value depends on the application field and the size restriction. It is generally not more than $\pi/6$, preferably $\pi/12$, and more preferably $\pi/18$. With a nozzle of non-circular nozzle section, the divergence angle can be defined correspondingly to the above definition of $\theta$.

For ultra-fine particles, the divergence of the beam can be evaluated from the $\theta$ value be means of a laser doppler velocimeter or photo correlation spectroscopy employing the technology of light-scattering spectroscopy.

On the other hand, there stands the following relation between the thermal energy and kinetic energy of a flow:

$$\frac{a^2}{\gamma - 1} + \frac{1}{2} u^2 = \text{constant} \quad (4)$$

Consequently the temperature of the flow can be regulated according to the flow speed, and particularly in the present invention, the raw materials or reaction products can be brought to frozen or supercooled state since the flow can reach an supersonic velocity.

The aforementioned equations (1) and (2) are valid only in case of adiabatic expansion of the flow but are no longer valid when the flow absorbs or releases heat in the convergent-divergent nozzle 1. However, even in such a case, an optimum expansion flow can be obtained by suitable regulation of P/Po and A/A* according to the amount of such heat absorption or generation.

The mass flow rate m of the flow passing through the nozzle 1 can be determined from the following equation (5), and is a function of the aperture area A* of the throat 1b for given values of the pressure Po and temperature To of the upstream chamber 2, or a function of said pressure Po and temperature To for a given value of the aperture area A* of the throat 1b:

$$\dot{m} = Po \left( \frac{\gamma}{RTo} \right) \left( \frac{2}{\gamma + 1} \right)^{\frac{\gamma+1}{2(\gamma-1)}} A^* \quad (5)$$

Consequently reaction products of a constant amount can be easily obtained continuously, and the supply of raw materials can be easily made corresponding to the amount of reaction products.

FIG. 1 shows an embodiment of the present invention, wherein shown are a convergent-divergent nozzle 1, an upstream chamber 2 and a downstream chamber 3.

The upstream chamber 2 and the downstream chamber 3 are mutually connected by the convergent-divergent nozzle 1, and the upstream chamber 2 is provided with a valve 5a for introducing a raw material A and a pressure sensor $S_1$ for detecting the pressure in the upstream chamber 2.

The downstream chamber 3 is provided with a valve 5b for supplying a raw material B to be reacted with said raw material A, and contains, in a position confronting the outlet 1c of the nozzle 1, a substrate 4 for capturing a reaction product C obtained by a reaction of the raw materials A and B. The substrate 4 is supported so as to be movable by a driving unit 10. The downstream chamber 3 is connected with a pump 5 through a valve 5c and with a pressure sensor $S_2$ for detecting the pressure in the downstream chamber 3.

The inlet 1a of the convergent-divergent nozzle 1 is opened in the upstream chamber 2 while the outlet 1c is opened in the downstream chamber 3. In the vicinity of said outlet 1c there is provided a pressure sensor $S_3$ for detecting the pressure of the flow at the ejection.

When the raw materials A and B are supplied as the downstream chamber 3 is evacuated by the pump 6, the raw material A is ejected from the upstream chamber 2 into the downstream chamber 3 through the convergent-divergent nozzle 1 and reacts in contact with the raw material B in the downstream chamber 3, thereby forming a reaction product C which is captured by the substrate 4. The flow forms an optimum expansion flow in a beam form through an adjustment of the pressure Po, P detected by the sensors $S_1$, $S_2$ in such a manner that the pressure Pj detected by the sensor $S_3$ be substantially equal to the pressure P detected by the sensor $S_2$. Also there may be employed a nozzle 1 with a ratio A/A* of the aperture area A of the outlet 1c to that A* of the throat 1b adjusted according to the necessary pressures Po and P.

As the raw material A is ejected as a beam flow into the downstream chamber 3, and contacts the raw material B during the flow in the downstream chamber 3 to form the reaction product C which is directly captured by the substrate 4, the raw materials, A, B as well as the product C are hardly diffused in the downstream chamber 3 and the product C can be continuously obtained with an elevated yield. A part of the raw material B is discharged from the system by the pump 6 but it can be recycled to the system.

The raw material A in the form of a beam flow has to be brought into sufficient contact with the raw material B in the downstream chamber 3. If the raw material B is gaseous and consists of molecules having a mean free path l, the molecules can be considered to be present at an interval l in the downstream chamber 3. Consequently, if said mean free path is constant, the frequency of contact, of the raw material A during the movement in the downstream chamber 3, with the molecules of the raw material B can be controlled by the adjustment of the flow path length in the downstream chamber 3. Said adjustment can be made, for example, by moving the substrate 4 with the driving unit 10 in the direction of flow path. Also said adjustment can be achieved by regulating the mean free path l of the gas molecules if the flow path length is constant in the downstream chamber 3.

The mean free path l of the gaseous molecules of the raw material B in the downstream chamber 3 can be determined approximately by the following equation (6):

$$l = \frac{1}{\sqrt{2}\ \pi n \sigma^2} \quad (6)$$

wherein $\sigma$ is the diameter of the gaseous molecules B in the chamber 3, and n is the number of molecules per unit volume. As the density $\rho$ of the gaseous molecules is expressed by $\rho = mn$, wherein m is the mass of the molecule, the equation (6) can be transformed into (6'):

$$l = \frac{m}{\sqrt{2}\ \pi \rho \sigma^2} \quad (6')$$

Since m and $\sigma$ are determined by the species of gas, l can be controlled by $\rho$, so that the frequency of collision of the molecules of the raw materials A and B can be controlled. Also l can be maintained constant by maintaining $\rho$ constant.

On the other hand, $\rho$ can be determined by the following equation (7):

$$\rho = \frac{P}{R\ t'} \quad (7)$$

wherein R is gas constant and t' is the temperature in the downstream chamber 3. Accordingly $\rho$ can be controlled by the pressure P of the downstream chamber 3 of the temperature t' thereof. Besides, as explained above, the flow velocity from a given convergent-divergent nozzle 1 is determined by P/Po if the temperature in the upstream chamber 2 is constant. Consequently a constant flow velocity can be obtained if the density $\rho$ of the gas molecules and the ratio P/Po are maintained constant. Particularly even with a short life of activity, the raw material A can be brought into sufficient contact with the raw material B within said active life, by maintaining the density $\rho$ of the gas molecules of the material B and the ratio P/Po constant, utilizing a flow speed determined by A/A* and P/Po and a flow path length which the molecules can travel within said active life.

Figure 2A:
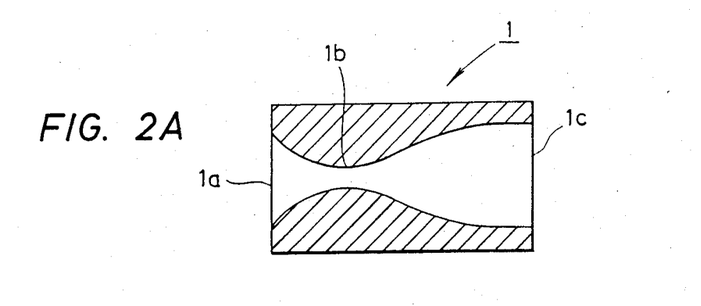
FIGS. 2A, 2B and 2C, are schematic views of examples of the form of the convergent-divergent nozzle.
Figure 2B:
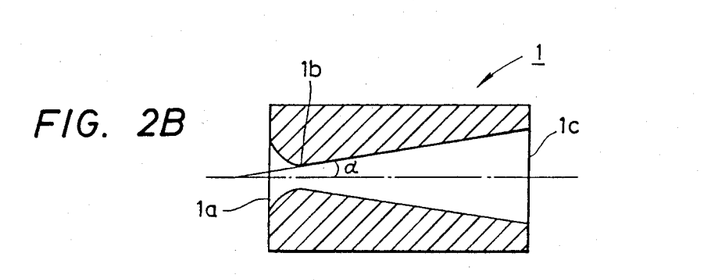
Figure 2C:
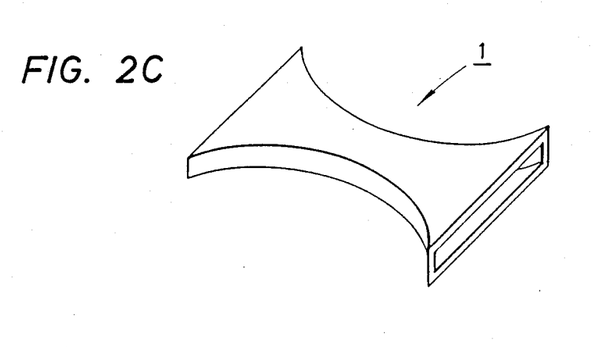

As explained before, the convergent-divergent nozzle 1 has an aperture which is gradually constricted from the inlet 1a to the throat 1b and is gradually diverges therefrom to the outlet 1c, and the differential coefficient of flow curve of the inner wall of the nozzle varies continuously and reaches zero at the throat to minimize the growth of a boundary layer of the flow in the nozzle 1. In the present invention, the flow curve of the inner wall means the curve of the inner wall in a cross section along the direction of flow. It is therefore rendered possible to select the effective cross section of the flow in the convergent-divergent nozzle 1 close to the designed value and thus to fully exploit the performance of the nozzle 1. Also as shown in FIG. 2A, the internal periphery of the outlet 1c is preferably substantially parallel to the cenral axis. A parallel flow can be obtained more easily in this manner, since the ejected flow follows the direction of internal surface of the outlet 1c. However, said parallel portion may be dispensed with if the angle $\alpha$ of the internal surface, from the throat 1b to the outlet 1c, to the central axis is maintained not exceeding 7°, preferably not exceeding 5°, as shown in FIG. 2B, since the peeling-off phenomenon does not occur easily in such state and the ejected flow is maintained almost linear. The absence of such parallel portion facilitates the manufacture of the convergent-divergent nozzle 1. Also a slit-formed flow can be obtained by the use of a rectangular nozzle as shown in FIG. 2C.

Said peeling-off phenomenon is a phenomenon of the enlargement of the boundary layer between the inner wall of the nozzle 1 and the passing fluid, for example in the presence of projections on said inner wall, leading to an uneven flow, and tends to appear when the velocity of the ejected flow is higher. The above-mentioned angle $\alpha$ should preferably be smaller when the inner wall of the nozzle 1 is finished less precisely, in order to prevent said peeling-off phenomenon. The inner wall of the nozzle 1 is preferably finished with a precision indicated by three, or preferably four, inverted triangles, as defined in the Japanese Industrial Standard B 0601 for the surface finishing precision. Since the peeling-off phenomenon in the divergent part of the nozzle 1 significantly affects the state of ensuing flow, the surface finishing precision should be determined principally on said divergent part, and the manufacture of the nozzle 1 can be facilitated in this manner. Also in order to prevent such peeling-off phenomenon, the throat should have a smooth curve in such a manner that the differential coefficient of the change of the cross section does not become infinitely large.

The convergent-divergent nozzle 1 can be composed of various materials, for example a metal, such as iron or stainless steel, plastic material such as acrylic resin, polyvinyl chloride, polyethylene, polystyrene and polypropylene, ceramics, quartz, or glass. Said material can be selected in consideration of the absence of reactivity with the raw material A or B or with the reaction product C, working property, gas emission in vacuum etc. Also the inner wall of the nozzle 1 may be plated or coated with a material of low reactivity, such as coating with polyfluoroethylene.

On the other hand, the inner wall of the nozzle 1 may be formed or coated with a material stimulating a chemical reaction. More specifically said inner wall may be formed with a catalyst-supporting material or a porous material with a catalytic function, or may be coated with a reactive material.

The length of the convergent-divergent nozzle 1 can be determined arbitrarily, for example according to the length of the apparatus. In passing the convergent-divergent nozzle 1, the flow is subjected to a conversion of the thermal energy thereof to kinetic energy, and a supercooled state can be obtained if the thermal energy of the flow is selected low and the speed thereof is selected high. Thus, a condensable component in the raw material A can be condensed and formed into fine particles by the decrease of temperature. In such case the convergent-divergent nozzle 1 should preferably be longer in order to achieve sufficient condensation. On the other hand, such condensation increases the thermal energy and decreases the kinetic energy. Consequently, in order to maintain a high-speed ejection, the nozzle 1 should preferably be shorter.

Figure 3A:
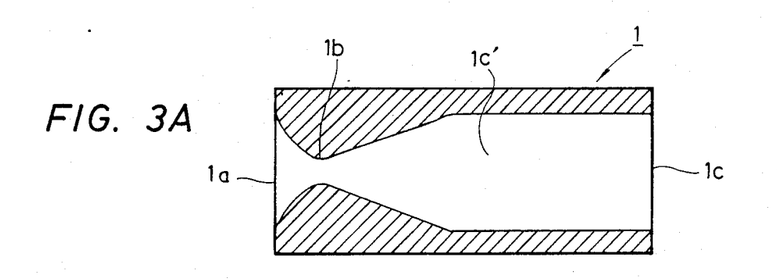
FIGS. 3A and 3B, are schematic views of examples of the form of the convergent-divergent nozzle.

FIG. 3A shows a nozzle structure in which the parallel portion in the vicinity of the downstream outlet is elongated. The nozzle with such elongated parallel portion provides a lower flow speed at the outlet, in comparison with the nozzle shown in FIG. 2A, but there are obtained particular distributions of pressure and temperature in the nozzle. More specifically, the pressure and temperature show isentropic decrease in the movement from the throat to an outlet portion $1c'$, but they are both increased again by the increase of thermal energy in the course of movement in the parallel portion. Consequently the pressure condition at the outlet 1c can be determined corresponding to thus increased pressure, and a low pressure condition can be realized without increasing the capacity of the pump.

Figure 3B:
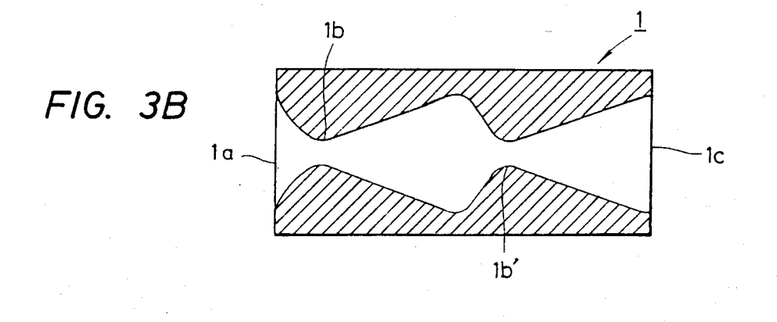

Also the convergent-divergent nozzle 1 may be provided, as shown in FIG. 3B, with two or more throats 1b, 1b', . . . If an optimum expansion flow is formed with such convergent-divergent nozzle of multiple stages, the flow is accelerated and decelerated repeatedly in the nozzle 1, with accompanying decrease and increase of temperature. It is therefore possible to stimulate the reaction by such temperature change.

Figure 4A:
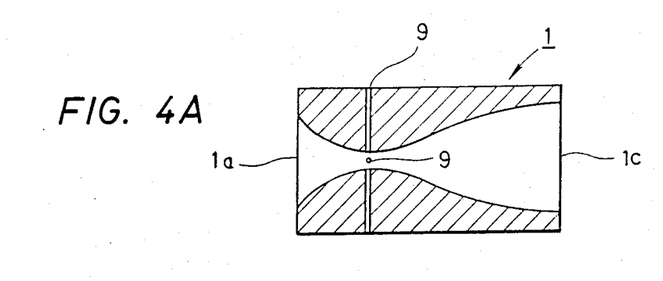
FIGS. 4A and 4B, are schematic views of examples of the form of the convergent-divergent nozzle.

Also as shown in FIG. 4A, the convergent-divergent nozzle 1 may be provided, at the wall of the throat, with plural raw material supply holes 9. In this structure, the raw material passing in the nozzle induces a Venturi effect, by means of which another raw material can be supplied as mist. This structure allows to supply said another raw material in quantitative manner even if it is liquid.

Figure 4B:
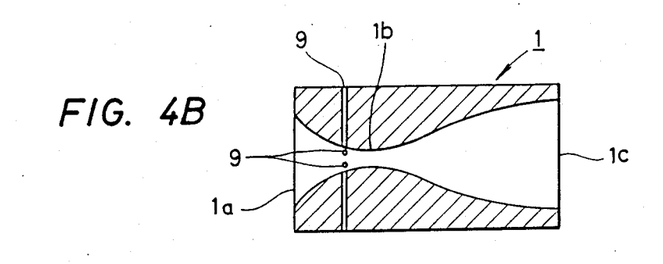

It is also possible, as shown in FIG. 4B, to form the supply holes 9 in a position between the throat 1b and the inlet of the nozzle 1, and to supply another raw material capable of reacting with the raw material flowing in the nozzle 1. In this case it is possible to prevent disorder in the flow ejected from the nozzle 1, by placing the supply holes 9 sufficiently apart from the throat 1b of the nozzle 1. The convergent-divergent nozzle 1 with such supply holes 9 is capable, for example in case of reacting two or more raw material in the flow, of preventing the deposition on the walls of the upstream chamber 2 by a reaction therein, since all the raw materials need not be supplied in said upstream chamber 2.

The reaction apparatus of the present invention is also capable of activating the raw materials by the supply of energy from the exterior in the nozzle. In the following there will be explained an example in which the nozzle itself is formed as electrodes.

Figure 5A:
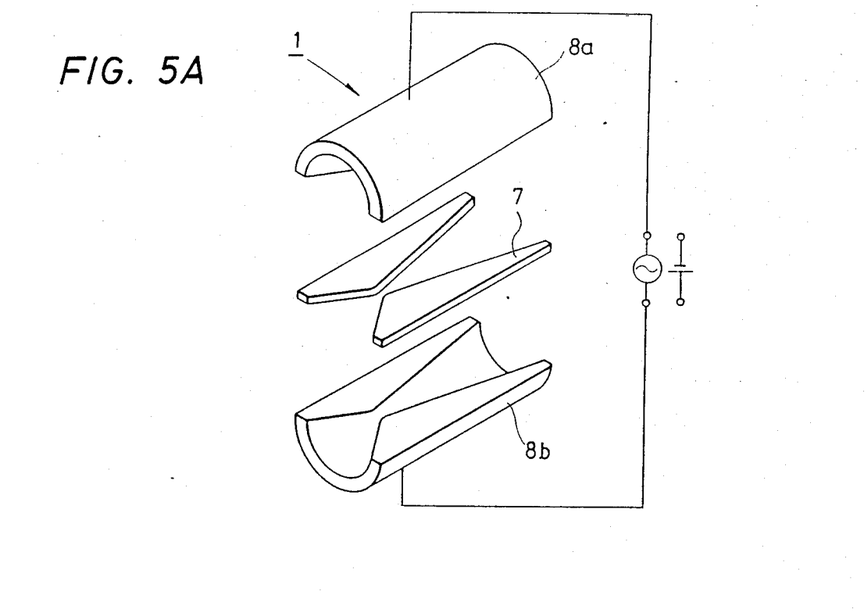
FIGS. 5A and 5B, is an exploded perspective view of a convergent-divergent nozzle incorporating electrode.
Figure 5B:
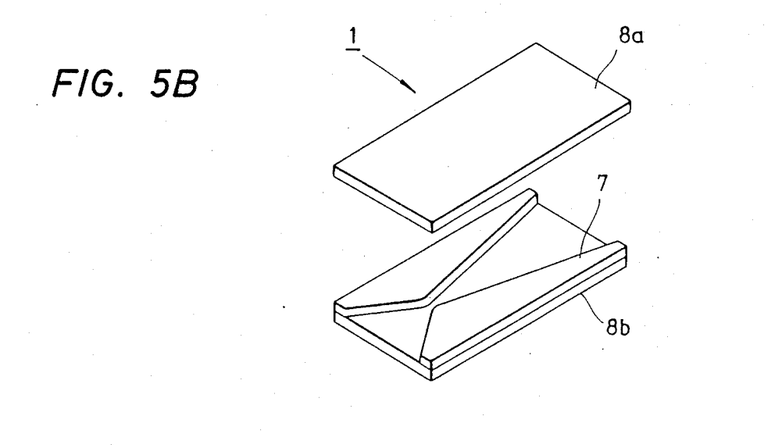

FIGS. 5A and 5B are exploded perspective views of a convergent-divergent nozzle constituting electrodes. Said nozzle is composed, as illustrated, of upper and lower members composed of electric conductors and constituting a pair of electrodes 8a, 8b, and electric insulators 7 positioned between said upper and lower members. A DC or high-frequency AC current is applied between said electrodes 8a, 8b to generate plasma in the nozzle 1. The electrodes 8a, 8b can be composed of a metal such as iron or copper. The electric insulators 7, separating the electrodes 8a, 8b can be composed for example of insulating plastics, ceramics, quarts or glass. These materials can be selected in consideration of the lack of reactivity with the reaction products, working properties, gas emission in vacuum etc. Also the inner wall of the upper and lower members of the nozzle may be plated or coated with an electric conductor capable of preventing reaction or deposition, or such plated or coated layer may be employed as the electrodes 8a, 8b.

The reaction product can be captured in an arbitrary area of the substrate 4 by inclining the nozzle 1 in the vertical or horizontal direction, or by causing a scanning motion at a regular interval. Such operating mode is useful in case of film formation with the reaction product C on the substrate 4, and particularly effective in combination with the rectangular nozzle shown in FIG. 2C.

The time from the reaction of the raw materials A, B to the capture on the substrate 4 can be regulated by moving the substrate to or away from the nozzle 1 by means of a driving unit 10. Thus a raw material or a reaction product with a very short life of activity can be captured in the active state by positioning the substrate 4 close to the position of activation. The substrate may be heated or cooled in order to facilitate capturing. Particularly by cooling the substrate 4, the capture thereon may be achieved by condensing or solidifying.

It is also possible to receive the beam over a large area by supporting the substrate 4 with the driving unit 10 in rotatable manner or movable manner in the vertical and horizontal directions. It is furthermore possible to treat the substrate 4 of a web form with the reaction product C by receiving the beam while the substrate is gradually advanced from a roll. Furthermore the treatment with the reaction product C may be applied on a rotating drum-shaped substrate 4.

The reaction may also be conducted by intermittently opening and closing the nozzle 1 with a valve. Under a given evacuating condition, such intermittent opening and closing allow to achieve a high degree of vacuum more easily in the downstream chamber 3. On the other hand, if the upstream chamber 2 is pressurized, such elevated pressure can be more easily maintained. Also in case an energy for activation etc. is supplied in the nozzle or in the downstream side thereof, such energy supply may be synchronized with said intermittent opening and closing to economize energy.

Examples of the energy supplied according to the present invention are microwave and other electromagnetic waves, light of various wavelengths such as ultraviolet light, infrared light or a laser beam, and an electron beam.

Figure 6:
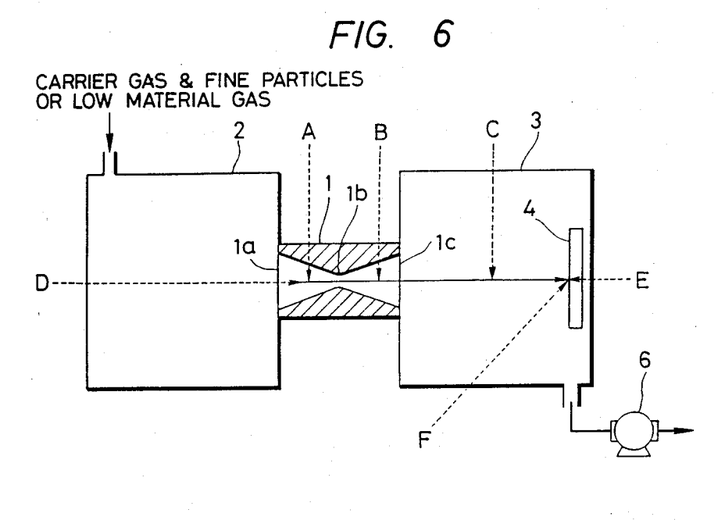
FIG. 6 is a schematic view showing other embodiments of the present invention.

The above-mentioned energy supply to the fine particles can be carried out at the upstream side of the throat 1b of the convergent-divergent nozzle 1 as indicated by A in FIG. 6, in the downstream side of the convergent-divergent nozzle 1, including the throat thereof, as indicated by B, in the flow path behind the nozzle 1 as indicated by C, along the flow path from the upstream side of the nozzle 1 as indicated by D, along the flow path from the rear side of a trans parent substrate 4 as indicated by E, diagonally to the crossing point of the flow path and the substrate 4 as indicated by F, or by the combinations thereof.

The energy supply at the position A or B allows to use the interior of the nozzle 1 as a field for generating fine particles and as a field of reaction, thereby eventually dispensing with the upstream chamber 2.

The energy supply in the direction of D, if conducted with a laser beam, allows to obtain a film of fine particles on the substrate 4, only on the extension of a small area irradiated by the laser beam. In this state, if the laser beam reaches the surface of the substrate 4, laser annealing can be simultaneously applied to said surface. Also in case of supply of energy of another wavelength region, the position of gas excitation can also be arbitrarily selected by the intensity and transmittance of the energy.

The energy supply in the direction of E allows to simultaneously elevate the temperature of the substrate 4, thereby promoting the deposition of fine particles onto the substrate 4.

The energy supply in the direction of F allows to simultaneously achieve heating of the substrate 4, reaction on the surface thereof, and annealing effect.

FIGS. 7A to 7D show examples of reaction conducted in the apparatus of the present invention.

Figure 7A:
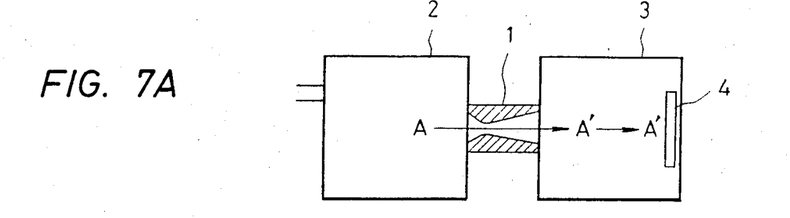
FIGS. 7A, 7B, 7C and 7D, are schematic views showing other embodiments of the present invention.

In case of FIG. 7A, the raw material A supplied into the upstream chamber 2 is activated for example by the energy supply in the nozzle 1 or in the beam state thereafter to generate a physically modified species A' which is captured on the substrate 4 in the downstream chamber 3.

Figure 7B:
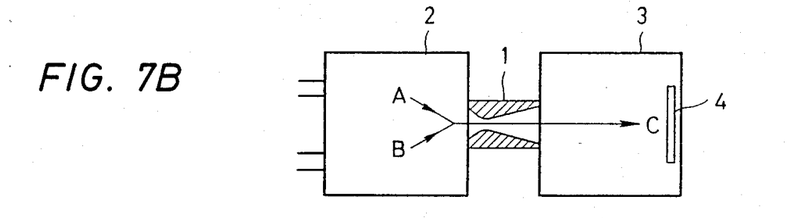

In case of FIG. 7B, the mutually reacting raw materials A, B are supplied in the upstream chamber 2 and generate the reaction product C before they reach the substrate 4 through the nozzle 1, and said reaction product C is captured by said substrate 4 in the downstream chamber 3. In this case at least the inner wall of the nozzle 1 may be composed of a catalyst stimulating the reaction of the raw materials A, B.

Figure 7C:
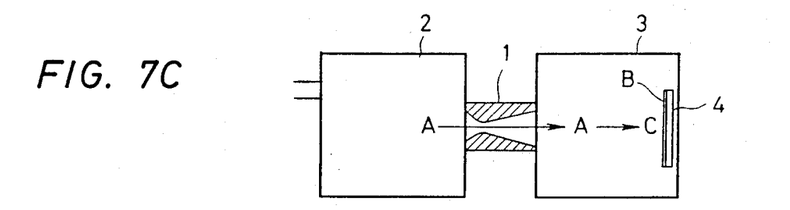

In case of FIG. 7C, the raw material A supplied into the upstream chamber 2 is formed as a beam and reaches the substrate 4 in the downstream chamber 3. The surface of the substrate 4 is composed of the raw material B capable of reacting with the raw material A, and the beam thereof collides with the surface of the substrate 4 and reacts with the raw material B to be captured as the reaction product C. In case of effecting reaction on the surface of the substrate 4, the kinetic energy of collision of the ultrasonic beam with the substrate 4 can be utilized for the reaction. The raw material B on the substrate 4 can be solid or impregnated therein.

Figure 7D:
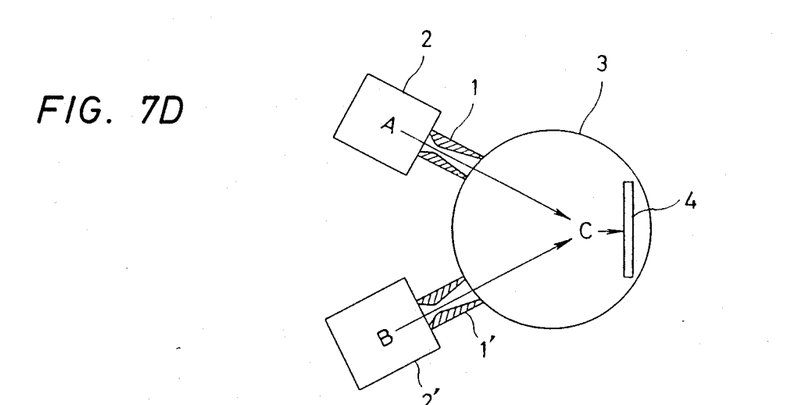

In case of FIG. 7D, the raw materials A and B are respectively supplied to separate upstream chambers 2, 2', and are supplied in separate beams through separate nozzles 1, 1' into a same downstream chamber 3. These beams collide with each other in the downstream chamber 3 to cause the reaction of the raw materials A and B, and the resulting product C is captured by the substrate 4. In this manner the start position of reaction of the raw materials A, B can be arbitrarily selected in the downstream chamber 3.

The apparatus of the present invention, being capable of transporting raw materials or reaction products as a beam in a determined direction, allows to minimize the decrease production yield caused by the interference with the walls of the downstream chamber and the diffusion of the flow, and to effect the reaction in a spatially independent area thereby obtaining a highly pure product without any interference in an ideal field of reaction. The supply of energy for reaction is facilitated since the diffusion of flow is suppressed, and the flow rate can be easily controlled. Consequently the energy can be supplied in an amount matching the reaction without waste. Particularly the present invention is useful for industrial mass production as the raw materials as well as reaction starting means such as an activation energy can be continuously supplied from the exterior, thus enabling continuous process over a prolonged period.

The use of an optimum expansion flow provides a large kinetic energy in a beam flow and enables to define an irradiated area, and these properties can be utilized for implantation of neutral particles, cutting, etching, etc.

On the other hand, the present invention, being capable of transporting raw materials or reaction products at an supersonic velocity, allows to receive the raw materials or reaction products of an extremely short life of activity by the substrate in the active state. Also since the flow can be brought to an energetically frozen state in the nozzle 1, it is rendered possible to define a microscopic state of the molecules in the flow and to deal with the transition from a state to another. It is thus rendered possible to effect a novel chemical vapor reaction, in which the molecules are defined even to the energy level thereof and are given an energy corresponding to said energy level. There is also provided a novel field of energy transfer, whereby there can be easily obtained intermolecular compounds formed with a relatively weak intermolecular force such as hydrogen bond or van de Waals force.

Furthermore, as the field of reaction can be concentrated to the nozzle, it is rendered possible to achieve effective energy supply, to compactize the apparatus and to realize the reaction in a flow system.

What is claimed is:

1. Apparatus for reacting a first substance with a second substance, comprising a convergent-divergent nozzle including a pair of electrodes, means for creating an electric field between the electrodes to generate active particles in the first substance, and gas supply means arranged to supply to the nozzle a carrier gas with the first substance dispersed therein, the second substance being arranged to react with the first substance issuing from the nozzle,
wherein the electrodes comprise longitudinally separated halves of the nozzle with electrically insulating material therebetween.

2. Apparatus for reacting a first substance with a second substance, comprising a convergent-divergent nozzle including a pair of electrodes, means for creating an electric field between the electrodes to generate active particles in the first substance, and gas supply means arranged to supply to the nozzle a carrier gas with the first substance dispersed therein, the second substance being arranged to react with the first substance issuing from the nozzle,
wherein the electrodes comprise coated or plated layers on the inner surface of the nozzle, the nozzle being formed of any electrically insulating material.

3. A method of reacting a first substance with a second substance, the first substance comprising active particles, which method comprises passing a carrier gas with the first substance dispersed therein through a convergent-divergent nozzle comprising a pair of electrodes, creating an electric field between the electrodes to generate active particles in the first substance, and causing the first substance issuing from the nozzle to react with the second substance,
wherein the electrodes comprise longitudinally separated halves of the nozzle with electrically insulating material therebetween.

4. A method of reacting a first substance with a second substance, the first substance comprising active particles, which method comprises passing a carrier gas with the first substance dispersed therein through a convergent-divergent nozzle comprising a pair of electrodes, creating an electric field between the electrodes to generate active particles in the first substance, and causing the first substance issuing from the nozzle to react with the second substance,
wherein the electrodes comprise coated or plated layers on the inner surface of the nozzle, the nozzle being formed of an electrically insulating material.

* * * * *

UNITED STATES PATENT AND TRADEMARK OFFICE
CERTIFICATE OF CORRECTION

PATENT NO. : 4,909,914

DATED : March 20, 1990

INVENTOR(S) : Yuji Chiba et al

It is certified that error appears in the above-identified patent and that said Letters Patent is hereby corrected as shown below:

ON THE TITLE PAGE

AT [56] REFERENCES CITED

U.S. Patent Documents, insert --3,801,346 Melton--.

COLUMN 4

Line 45, "be" (second occurrence) should read --by--.

COLUMN 5

Line 1, "mass flow rate m" should read --mass flow rate $\overset{\circ}{m}$--.

COLUMN 6

Line 65, "is" should be deleted.

COLUMN 9

Line 2, "quarts" should read --quartz--.

COLUMN 10

Line 59, "decrease" should read --decreased--.

UNITED STATES PATENT AND TRADEMARK OFFICE
CERTIFICATE OF CORRECTION

PATENT NO. : 4,909,914

DATED : March 20, 1990

INVENTOR(S) : Yuji Chiba et al

It is certified that error appears in the above-identified patent and that said Letters Patent is hereby corrected as shown below:

Column 11

Line 19, "a state" should read -- one state--.

Signed and Sealed this

Fourth Day of February, 1992

Attest:

HARRY F. MANBECK, JR.

*Attesting Officer*      *Commissioner of Patents and Trademarks*